(12) United States Patent
Zheng et al.

(10) Patent No.: US 7,983,057 B2
(45) Date of Patent: Jul. 19, 2011

(54) PCBA MOUNTING ASSEMBLY FOR TOOL-LESS ATTACHMENT AND RELEASE

(75) Inventors: An-Sheng Anson Zheng, Guangzhou (CN); Brett C. Ong, San Jose, CA (US); Michael T. Milo, Menlo Park, CA (US)

(73) Assignee: Oracle America, Inc., Redwood City, CA (US)

( * ) Notice: Subject to any disclaimer, the term of this patent is extended or adjusted under 35 U.S.C. 154(b) by 357 days.

(21) Appl. No.: 12/417,908

(22) Filed: Apr. 3, 2009

(65) Prior Publication Data
US 2010/0254078 A1 Oct. 7, 2010

(51) Int. Cl.
*H05K 7/02* (2006.01)
*H05K 7/14* (2006.01)
*H05K 5/00* (2006.01)
*H01F 27/32* (2006.01)
*F16B 21/18* (2006.01)

(52) U.S. Cl. ........ 361/810; 361/807; 361/752; 361/801; 174/138 E; 411/517; 411/530; 411/353

(58) Field of Classification Search .............. 361/807, 361/810, 728–729, 752–753, 758–759, 801, 361/804, 742, 770; 174/138 E; 411/517, 411/530, 353; 439/92, 95, 325–328; 29/739, 29/757, 832, 450, 456

See application file for complete search history.

(56) References Cited

U.S. PATENT DOCUMENTS

| | | | | |
|---|---|---|---|---|
| 3,812,756 A | * | 5/1974 | Wenger | 411/353 |
| 5,172,500 A | * | 12/1992 | Renski et al. | 37/457 |
| 6,124,552 A | * | 9/2000 | Boe | 174/135 |
| 6,404,646 B1 | * | 6/2002 | Tsai et al. | 361/758 |
| 6,424,537 B1 | * | 7/2002 | Paquin et al. | 361/752 |
| 6,695,629 B1 | * | 2/2004 | Mayer | 439/92 |
| 7,233,503 B2 | * | 6/2007 | Chen | 361/804 |
| 7,385,830 B2 | * | 6/2008 | Liu et al. | 361/810 |
| 2008/0019110 A1 | * | 1/2008 | Gilliland et al. | 361/810 |

* cited by examiner

*Primary Examiner* — Jayprakash N Gandhi
*Assistant Examiner* — Nidhi Desai
(74) *Attorney, Agent, or Firm* — Marsh Fischmann & Breyfogle LLP; Kent A. Lembke

(57) ABSTRACT

A mounting assembly is provided for use in mounting a printed circuit board to a computer chassis. The mounting assembly includes standoffs attached to the chassis wall to extend outward into the chassis. Each standoff includes an elongated body and a neck extending from the body and having a smaller diameter than outer dimensions of the body. Each standoff includes a head extending from the neck. The mounting assembly includes retention assemblies that are mounted to the printed circuit board. Each retention assembly includes a spring-force retention member (such as a single coil of a ring spring) with an inner passageway with an at rest diameter smaller than the head. The printed circuit board is mounted to the chassis wall by pressing the printed circuit board onto the standoff elements, which are clasped by a spring force applied by each of the spring-force retention members on the standoff necks.

15 Claims, 6 Drawing Sheets

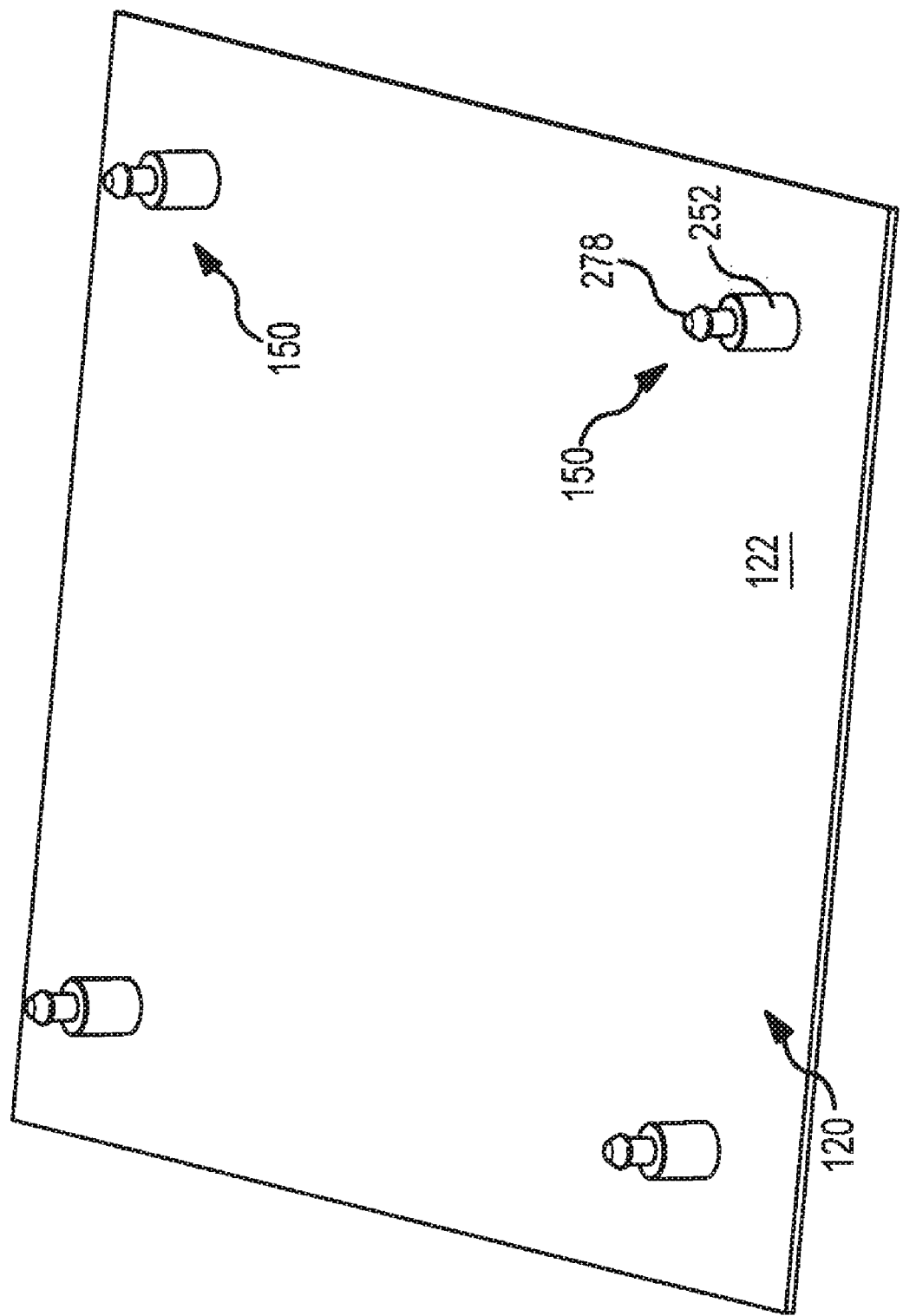

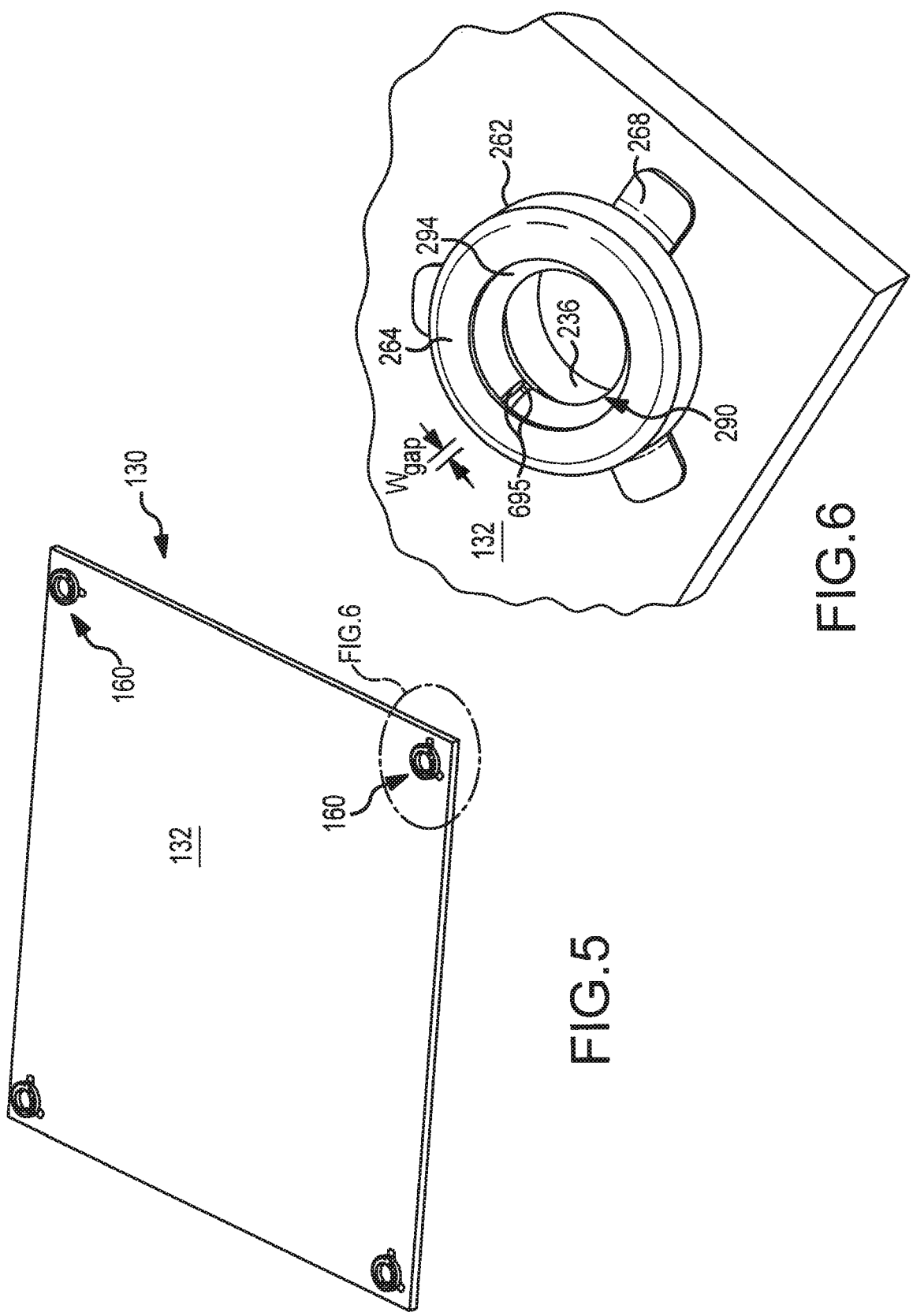

PCBA MOUNTING ASSEMBLY FOR TOOL-LESS ATTACHMENT AND RELEASE

BACKGROUND

1. Field of the Invention

The present invention relates to an improved mounting mechanism attaching a computer board such as a printed circuit board assembly (PCBA) to a chassis board/wall/surface or other computer support wall or to another board such as motherboard and, in particular, to a device that allows tool-less attachment of a PCBA or other computer board to or within a computer chassis and also typically allows tool-less and/or quick release from the chassis to facilitate maintenance or replacement.

2. Relevant Background

Computing devices (i.e., servers, personal computers, and the like) are generally produced with an open architecture design to allow additional functions to be later added to the device such as by adding or replacing one or more printed circuit board assemblies or PCBAs. For example, a motherboard is a PCBA on a computing device that supports the main processing components and provides electrical connections to ancillary components such as power supplies, disc drives, and the like. To add additional functionality to the computing device, expansion boards of differently configured PCBAs (also referred to as expansion cards, expansion modules, adapter cards, accessory cards, and so on) can be inserted into an expansion socket on the motherboard. Examples of expansion boards include but are not limited to graphics cards, sound cards, network cards, modems, and printer ports.

Due to the increasing density of computer devices such as servers, PCBAs and expansion boards are being positioned ever closer to each other within the computer chassis. Such tight spacing or limited real estate for computer components results in awkward PCBA placement, and it often can be difficult to provide direct and unobstructed access to the PCBA for assembly of the computer device and servicing. For example, a PCBA may be mounted vertically onto the chassis or a wall/support attached to the chassis, but the physical arrangement may not provide direct access for a screwdriver to facilitate installation/assembly and/or it may not allow for later removal (e.g., after additional components are installed near the PCBA). In an attempt to address these PCBA mounting problems, complex retention and attachment mechanisms have sometimes been designed and used in computer devices to mount PCBAs. However, these mechanisms often require special tools and involve use of a number of loose or additional mounting components including fasteners that add to assembly costs and often are dropped into the chassis or lost. Additionally, these complex mounting mechanisms are often bulky or large and take up significant amounts of space within the chassis, which uses up precious real estate or space within the chassis that has limited the adoption and use of these devices.

Hence, there remains a need for improved devices for mounting expansion boards within the box or chassis of a computer device such as a server. Preferably, such mounting devices would facilitate both installation and removal of the expansion board and would also provide a stabilizer to minimize risk of damage during movement of the computer device (e.g., during shipping or other movements that may cause the device and its boards to flex or vibrate).

SUMMARY

The inventors recognized the usefulness of providing an improved device for mounting PCBAs and other boards within a chassis of a computer device such as a server. To this end, a board or PCBA mounting assembly is described herein that facilitates tool-less installation or assembly and also provides tool-less and quick release from the chassis. The mounting assembly is user friendly and simple to use as the PCBA or other board may simply be pressed into place within a chassis without tools and with self-aligning achieved by the design of components of the mounting assembly. There is no loose or non-retained hardware that can be lost or dropped during assembly, and the PCBA along with the mounting assembly provide a compact form factor that enables placement in areas in a chassis with tight or small space constraints. Further, the mounting assembly is relatively inexpensive to fabricate, which provides a low cost of implementation.

An apparatus or mechanism is provided for facilitating retention and extraction of boards (such as printed circuit boards, PCBAs, expansion boards, and the like) within a computer chassis without requiring tools and providing a quick release functionality. Particularly, a mounting assembly is provided for use with a printed circuit board that has at least two holes and, more typically, four holes to facilitate mounting the chassis. The mounting assembly may include a set or plurality of standoff elements, or more simply "standoffs", that are securely clinched or attached to the chassis wall so as to extend outward into an interior space of the chassis (e.g., with their longitudinal axes substantially parallel). Each standoff may include an elongated body and a neck extending from the body (and having a smaller diameter than outer dimensions of the body so as to define a shoulder or shelf on the body for mating with or abuttingly supporting the printed circuit board adjacent the mounting holes). Each standoff may also include a head extending from the neck.

The mounting assembly may further include a set or plurality of retention assemblies mounted to a surface of the printed circuit board. Each retention assembly may include a spring-force retention member (such as a single coil of a ring spring) with an inner passageway with an at rest (or first) diameter that is smaller than at least a portion (or outer dimension) of the head. Hence, the printed circuit board may be mounted to the chassis wall by pressing the printed circuit board onto the standoff elements, which are captured or clasped by a spring force applied by each of the spring-force retention members on the necks of the standoff elements. The spring-force retention member is expandable to allow the head to pass through the passageway during mounting. In some cases, the spring-force retention member is a single coil of a ring spring with an inner diameter smaller than about the greatest diameter/outer dimension of the standoff head. In this case, the ring spring may include a gap between a first and second end that allows it to be expanded by the head being forced through the passageway (or hole in the ring spring). Each of the retention assemblies may include a retainer or spring holder that retains the spring-force retention member adjacent the holes in the printed circuit board, and the retain or spring holder includes a sidewall that is spaced apart from an outer surface of the retention member or ring spring to allow a predetermined quantity of expansion of the retention member during mounting (e.g., to hold a ring spring loosely within a spring holder to allow expansion without requiring any or very little compression of the ring spring).

The head of each standoff may include a shoulder adjacent to the neck and a tip distal to the shoulder, with the shoulder having a diameter greater than the tip to define a chamfered or sloped contact surface on the outer portions or sides of the head. The neck of each of the standoffs may have a height greater than about a combined thickness of the board and the retention member (or the retainer/spring holder, which typically has a low profile or height of less than about 5, mm and more typically less than 2, to 3, mm). The neck of each of the standoffs may have a circular cross sectional shape when viewed along a longitudinal axis of the standoff, and this circular cross section may have a diameter greater than about the at rest (or first) diameter of the neck of the standoff such that the retention member cannot fully return to its at rest configuration and applies a retention or spring force against the neck to hold the board in place on the standoff.

BRIEF DESCRIPTION OF THE DRAWINGS

FIG. 4 is a perspective view of a partially assembled computer device showing the chassis after insertion/installation of the standoff elements and prior to application of the PCBA or other computer or electronics board;

FIG. 5 is a perspective view of a partially assembled computer device showing the PCBA or other board with a set of retention assemblies affixed to a first ("upper" or "outer") surface of the PCBA and prior to mounting onto the standoff elements on the chassis (as shown in FIG. 4);

FIG. 6 is an enlarged view of one of the retention assemblies showing the use of a retainer housing (or spring holder) to retain/house a spring-force retention member (e.g., a spring element such as a spring ring)

DETAILED DESCRIPTION

Figure 1:
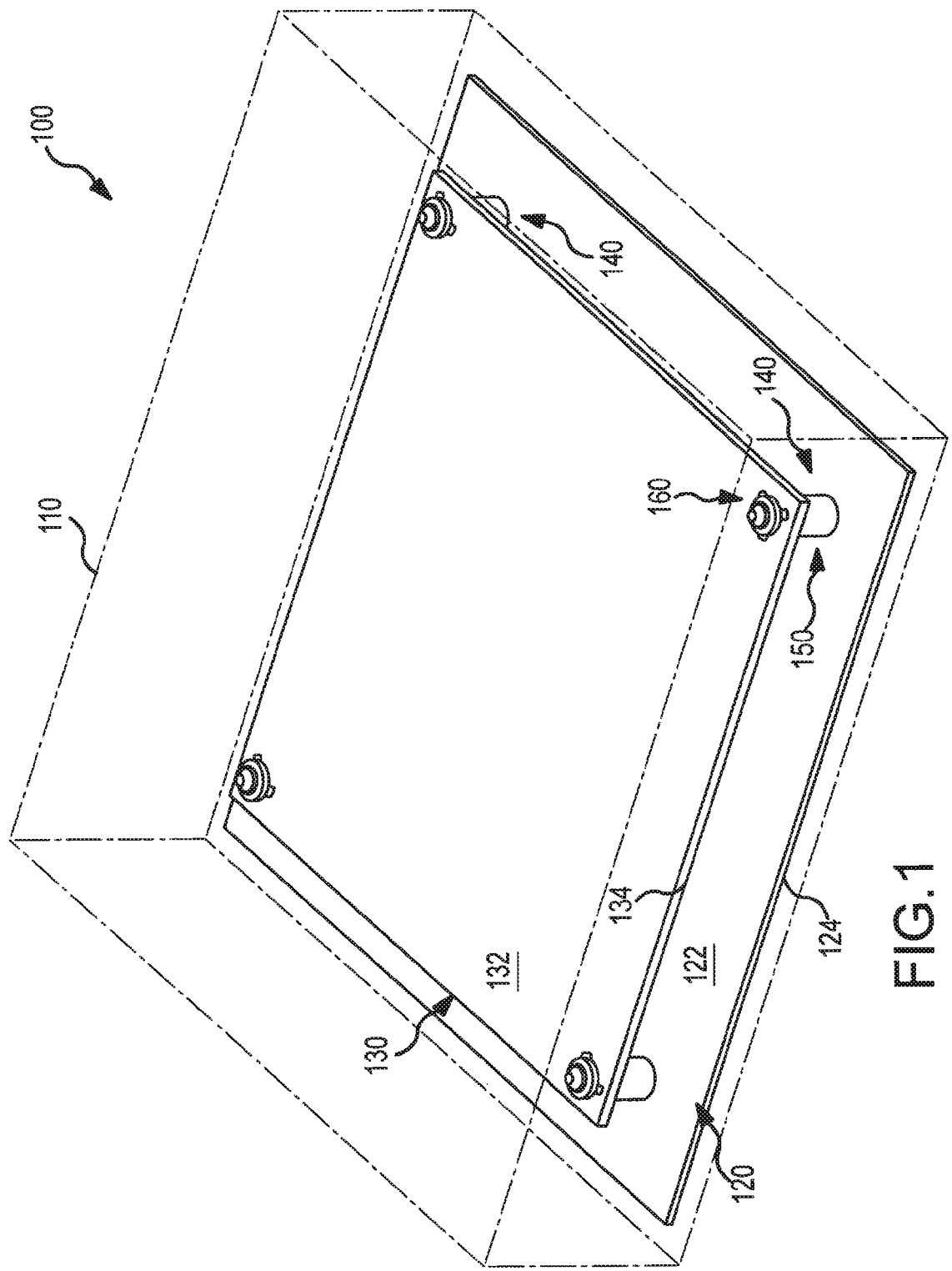
FIG. 1 is a perspective view of a computer device such as a server or the like with a board such as PCBA mounted to a chassis or chassis wall/support using a tool-less mounting assembly of one useful but not limiting embodiment.

Briefly, a board mounting assembly is provided for mounting boards such as PCBA or similar boards within a chassis or box of a computer device such as a server (e.g., to a chassis surface such as an enclosure wall, to another board, or the like). The mounting assembly may be adapted to support installation, removal, and retention of the board without use of tools or additional fasteners or hardware (e.g., other than that previously affixed to the chassis and/or board itself). The mounting assembly may be thought of as a quick-mount device or a tool-less, quick-release PCBA or board retention/attachment mechanism.

The mounting assembly generally includes two or more spring or other spring-force retention members that are each housed and retained within a retainer housing (or spring holder), which may be mounted onto a surface of the PCBA or board. Specifically, the retainer housing includes a channel or hole for receiving a standoff element (or allowing the standoff element to pass through the housing) and may be mounted adjacent to (or about) a hole extending through the PCBA or board (e.g., at each of the four corners of the board when four retention members and standoff elements are used in the mounting assembly). Mounting of the retainer housings may be performed using soldering, surface mount technology (SMT), or the like. Within each retainer housing of the mounting assembly, the integrated spring or retention member attaches to a standoff element that may be mounted to the enclosure or chassis, and, more specifically, the retention member includes a hole or passageway through which the standoff element extends. As the standoff element passes through the passageway, it applies an outward force to the retention member with a sloped or chamfered head causing the passageway to expand in size (e.g., its inner diameter increases to match the portion of the retention member passing through), and then once the head passes through, the retention member attempts to return to (or near to) its original or non-deformed shape and size at which point it contacts a necked portion (or neck) of the standoff element. At this point, the retention member applies a retention force (e.g., a spring force) against the surface of the neck and/or a shoulder or base portion of the standoffs head. The use of the retained spring or retention member eliminates the need for loose hardware or fasteners and provides a relatively simple (less complex) mechanism for mounting a PCBA or other board within a computer enclosure or chassis.

With use of the mounting assembly in a computer device, a PCBA may be simply pressed onto the standoff elements affixed to the chassis (or a support in the computer enclosure) and retained in place. The standoff elements along with the retention assemblies provide a self-aligning aspect that facilitates assembly (e.g., the board or PCBA may be aligned within the chassis due to the use of a chamfered head on each standoff element and since each of the standoff elements may be substantially identical and arranged to extend out from a surface of the chassis or support in a substantially parallel manner (e.g., the longitudinal axes of the standoff bodies are substantially parallel to each other)). This alignment makes installation of the PCBA or board relatively easy and does not require precise alignment, matching tightening of screws or other fasteners, or the like. Removal is also simple as one may pull on the PCBA or board to release the PCBA or board from the standoff elements (e.g., to disengage the retention members or springs from the standoff elements).

The mounting assembly provides a tool-less, quick-releasing PCBA board retention and attachment mechanism. This allows PCBA placement in areas or spaces of a computer device enclosure or chassis with tight space constraints and, in some cases, with awkward angles for receiving the board or PCBA. The mounting assembly may be designed to be tool-less and provide blind mating between the PCBA and the chassis or support (or between components of the mounting assembly as shown in the attached figures). The spring-force retention members allow for retention of a board without a direct line of sight (e.g., installation and removal can be done by feel in some cases) and/or without a tool access (e.g., without being able to get a screwdriver or other fastener tool onto or against portions of the board or PCBA). Service and assembly is greatly enhanced as the need for tools and use of loose hardware is eliminated.

Turning now to the figures, FIG. 1 illustrates a perspective view of one embodiment of a computer or computing device 100 that includes a mounting assembly 140 adapted for facilitating tool-less installation, retention, and quick-release/removal of computer boards such as PCBAs, expansion boards, and the like. The computer 100 includes an enclosure or chassis 110 with a support surface 120 such as a wall or surface of the chassis/enclosure 110 (and sometimes more simply element 120 may be thought of as the chassis of computer 100 or any support surface within or apart of such a computer including a surface of another board within the computer 100). The mounting assembly 140 may be affixed to the chassis surface 120 via a set or plurality of standoff elements 150 that extend through the chassis surface 120 from a lower or outer surface 124 to and past an upper or inner surface 122. In the mounting assembly 140 shown in FIG. 1, four standoff elements 150 are used to mount a board (such as a PCBA) 130 to the support surface or wall 120, but, in other embodiments, a fewer or greater number may be used such as a number of standoffs 150 (and paired retention assemblies 160) ranging from two to eight or more. The number used may depend upon the size and shape of the board 130, but four allows a standoff 150 to be provided at or near each corner of a rectangular board 130 to evenly distribute forces on the board 130 during installation and removal (as well as during shipping and use).

As will become clear, each standoff element 150 extends through a hole or opening in the board 130 such that it can extend through the board 130 from a lower or outer surface 134 to and past an upper or inner surface 132 of the board 130. More particularly, each of the standoff elements 150 abuts the lower or outer surface 132 of the board 130 (e.g., with a support shoulder or shelf) while a neck portion extends through the board 130 such that a portion of the neck and a head portion extend out from or above the surface 132 (e.g., out when the board 130 is vertically mounted on a vertical wall 120 of the chassis 110 and above when the board 130 is mounted on a horizontal wall or base 120 of the chassis 110). As shown, the board 130 is spaced apart (or stood off) from the chassis wall 120 such that a space is provided between the surfaces 122 and 134, and this spacing may be relatively small such as several millimeters to relatively large such as ten to thirty millimeters depending on the computer 100 and desirability of such a spacing (which is defined by the height of the body of the standoff elements 150).

A set or plurality of retention assemblies 160 may be provided in the mounting assembly 140 to retain the board 130 on the standoff elements 150. Specifically, a retention assembly 160 may be paired with each of the standoffs 150, and each assembly 160 may be mounted to the board 130 adjacent or about the holes in the board 130. For example, as shown, the retention assemblies 160 may be mounted on the inner or upper surface 132 of the board 130 such as by soldering, SMT, with fasteners (not shown), or the like. As is explained below, each retention assembly includes a retainer housing or spring holder that contains a retention member(s), with the housing and retention member having a hole or passageway that allows the head and neck of the standoff 150 to pass. With the standoff 150 within this passageway and extending through the hole in the board 130, the retention member applies a spring force to capture or attach to the standoff element, and, in this configuration, the mounting assembly 140 acts to retain the board 130 within the enclosure or chassis 110 of the computer or computing device 100. For clarity, not all traditional components of the server or computer 100 have been shown. The computer or server 100 may be a conventional design and generally includes a chassis 110, one or more hard drives, at least one processor (e.g., IC, chips, and the like on board 130), memory, additional boards (horizontal and/or vertical), and the like.

Figure 2:
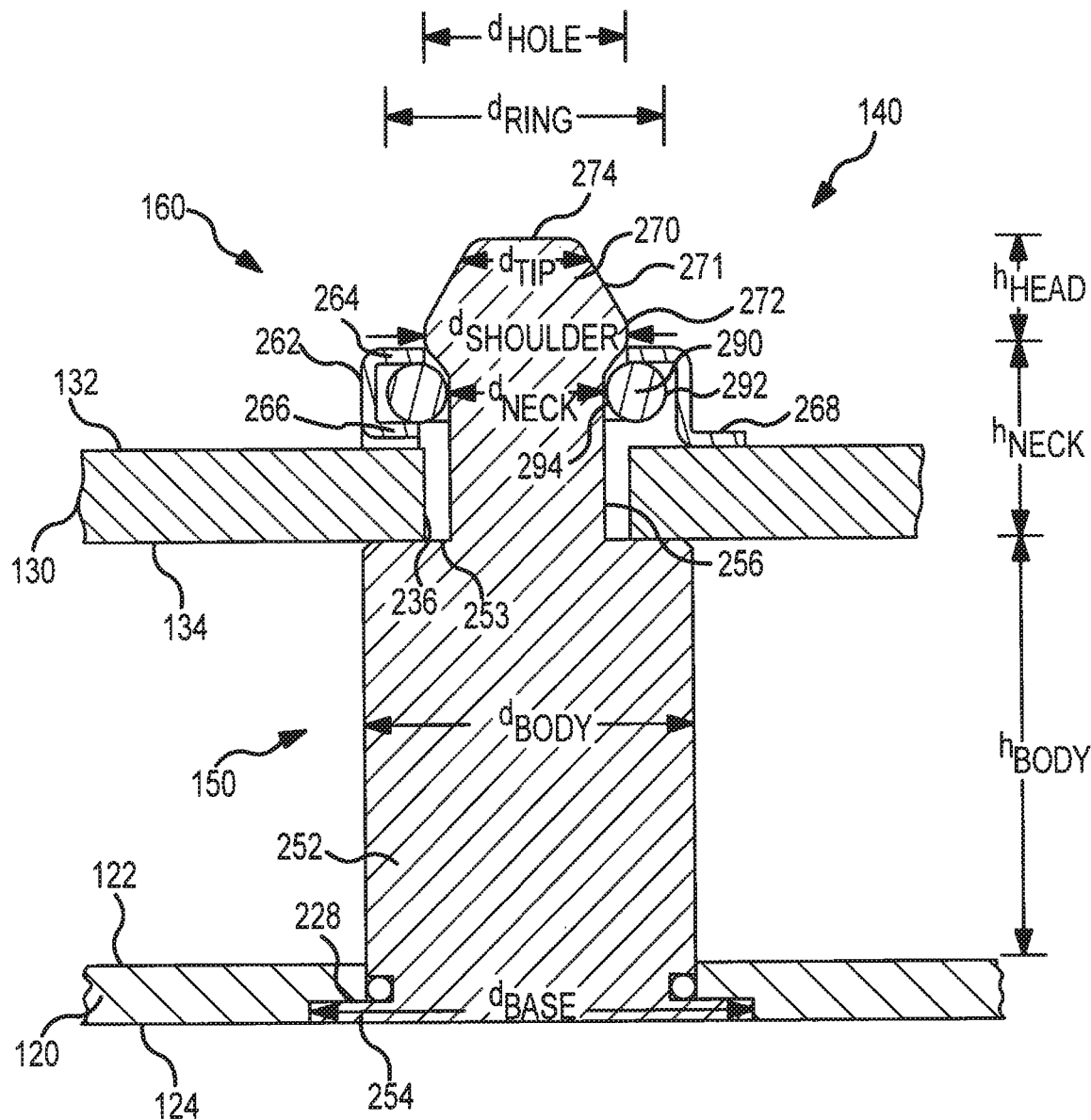
FIG. 2 is a side cross sectional view of one standoff element of the mounting assembly of FIG. 1 showing in more detail components of the mounting assembly and retention of a PCBA on, or in a position relative to, the computer device chassis.

FIG. 2 illustrates a sectional view of one paired standoff element 150 and retention assembly 160 of the mounting assembly 140 during use to retain a board 130 on or in a position near the chassis or enclosure wall 120. As shown, the standoff element 150 includes a body 252 that extends from a base 254. The body and base 252 (and other components of the standoff element 150) may be circular in cross sectional shape such as to facilitate manufacture but this is not required to practice the invention. The base 254 has a diameter, $d_{Base}$, that is greater than the diameter, $d_{Body}$, of the body 252 such that body 252 may extend through a hole or opening through the wall 120 while the based 254 abuts or contacts a shelf or ledge 228 (e.g., a recessed shelf allowing base 254 to be flush or nearly so with wall surface 124). For example, the diameter, dBase, may be 1, to 3, millimeters or more greater than the diameter, $d_{Body}$, which may range from up to several millimeters to many millimeters (e.g., with 2, to 4, mm used in some cases). The base 254 may then be affixed to the wall 120 such as with fasteners (not shown), by an interference fit with the hole and body 252, and/or with soldering or the like between base 254 and wall 120.

FIG. 4 illustrates a perspective view of a wall 120 upon which four standoff elements 150 have been attached or mounted such that the bodies 252 extend from the surface 122 of the wall 120 (e.g., with longitudinal axes of the bodies 252 substantially parallel) and such that the heads 270 are ready to receive the board 130. As shown, each of the standoff elements 150 may be clinched with the metal chassis 110. Each standoff 150 may a similar (or even identical within manufacturing tolerances) shape and size (i.e., configuration) such that a received board 130 will be properly aligned relative to the board 120 (e.g., spaced apart an equal distance from the surface 122 near each standoff element 150). The standoff elements 150 may be fabricated from a variety of materials such as stainless steel, brass, rigid, plastic, and/or a hard rubber. In some embodiments (not shown), the standoff elements 150 are screwed or threaded into the chassis wall 110 while in other cases fasteners are used to hold the base 254 of the standoff elements 150 to the wall 110.

Figure 3:
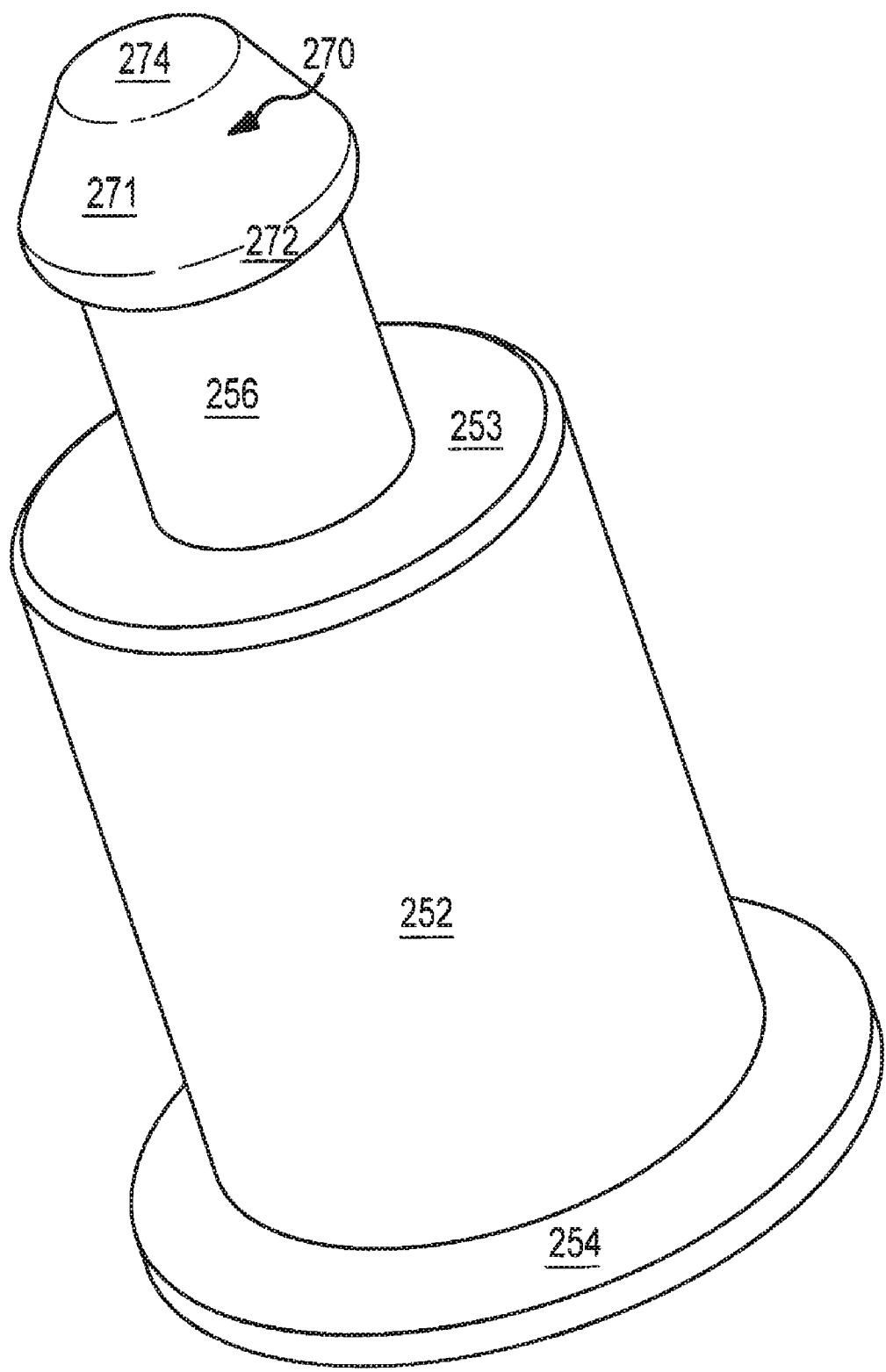
FIG. 3 is a perspective view of a standoff element of FIGS. 1 and 2.

FIG. 3 illustrates a perspective view of one of the standoff elements such as element 150 of FIGS. 2 and 4. As shown, the body 252 extends outward from the base 254 and the body terminates a shoulder or shelf 253 (or board receiving surface), and a neck 256 extends from the shoulder 253. A head 270 may be provided upon the neck 256 and includes a sloped or chamfered surface 271 extending from the tip or top 274 to a shoulder or base 272 of the head 270. Turning again to FIG. 2, it can be seen that the standoff element 150 mates with the lower or outer surface 134 of the board 130 when the board 130 is placed over the head 270 of the element 150. The height, $h_{Body}$, of the body 252 defines the spacing between the wall surface 122 and the outer or lower board surface 134, and the minimum height, $h_{BODY}$, of the main cylinder or body 252 may be chosen to be about 3, to 5, mm (or more) to provide clearance between active components or leads on the board 130 and the exposed sheet metal of the wall/enclosure 120. In this way, the neck 256 extends through a hole 236 in the board 130 with a portion extending above the inner or upper surface 132 of the board 130. The neck 256 has a, diameter, $d_{Neck}$, that is less than the diameter, $d_{Hole}$, of the hole 236 while the neck 256 has a height, $h_{Neck}$, that is substantially greater than the thickness of the board 130 such that the neck 256 can readily pass through the hole 236 and extend upward a distance to allow the retention assembly 160 to capture or attach to the neck 256. For example, the hole diameter, $d_{Hole}$, may be 2, to 6, mm (with a standard board hole often being about 3 mm in diameter) while the neck diameter, $d_{Neck}$, may be 0.5, to 2, mm less or the like than the hole diameter, $d_{Hole}$.

As shown, the mounting assembly 140 includes a retention assembly 160 paired with each standoff element 150 (e.g., four assemblies 160 when four standoffs 150 are included in mounting assembly 140). The retention assembly 160 includes a retainer or spring holder 262 that extends about the periphery of the hole 236 in board 130, and the assembly 160 is affixed to the board 130 such as be being rigidly attached via soldering, SMT, fasteners, or the like to inner or upper surface 132 of board 130. FIG. 5 illustrates a board 130 such as a PCBA upon which a set of retention assemblies 160 have been attached such that the holes 236 in the board 130 are uncovered or substantially unblocked such that the board 130 shown in FIG. 5 can readily be pressed or fit onto a chassis wall 120 such as that shown in FIG. 4 with a like number of standoff elements 150.

As shown in FIG. 2, the retainer or spring holder 262 has one or more legs 268 that extend outward from the wall of the retainer 262 (e.g., one to four or more attachment legs or tabs 268 may extend out from the retainer wall such as the three shown in FIG. 6). The legs 268 are placed in abutting contact with the inner or upper surface 132 of the board 130 and rigidly attached such as by soldering or SMT. The retainer 262 further includes a top wall 264 and a bottom wall or a set of tabs 266 that extend inward toward the passageway or hole provided in the retainer 262 that is designed to allow the head 270 of the standoff element 150 to pass through the retention assembly 160 (e.g., a hole or passageway with a shape and size that are at least as big as the largest diameter of the head 270 such as greater than or about equal to the shoulder/base diameter, $d_{Shoulder}$).

Significantly, the retention assembly 160 includes a spring-force retention member 290 that may take the form of a ring-shaped spring (or ring spring or one or more loops of a ring-type of spring), a rubber or other resilient material bushing, an assembly with one or more springs, or other resilient/spring mechanism. As shown, the retention member 290 is circular in cross section but this is not required as other cross sections may be used to provide the spring force used to retain the board 130 on the standoff 150. Also, as shown in FIGS. 2 and 6 the retention member 290 forms a loop that extends about the periphery of the hole 236 in the board 130, but the ring diameter, $d_{Ring}$, is typically some amount smaller than the hole diameter, $d_{Hole}$, such that an object sized smaller than the hole 236 may cause the spring retention member 290 to expand outward and then to attempt to return to an original size and shape, thus applying an inwardly directed spring (or retention) force. Specifically, the retention member 290 may be thought of as having an at rest or first diameter that is smaller than the hole diameter, $d_{Hole}$, and a second diameter, $d_{Ring}$, as shown where it has expanded to receive the chamfered head 270 but then spring back toward the first or at rest diameter. To facilitate the retention member 290 in expanding ends 695 of the member 290 may be spaced apart a gap width, wgap, such as up to 1, mm or more. The retention member 290 includes an outer surface 292 that may be pushed outward toward the retainer or spring holder 262 and an inner contact surface 294 defining its inner diameter and making contact with the sloped or chamfered surface 271 of the head 270 as the board 130 is pressed onto the standoff element 150. The inner surface 294 also abuts or contacts the neck 256 (and in some cases the base or shoulder 272 of the head 270 to apply the retention or spring force to retain the board 130 on the standoff element 150.

Figure 7:
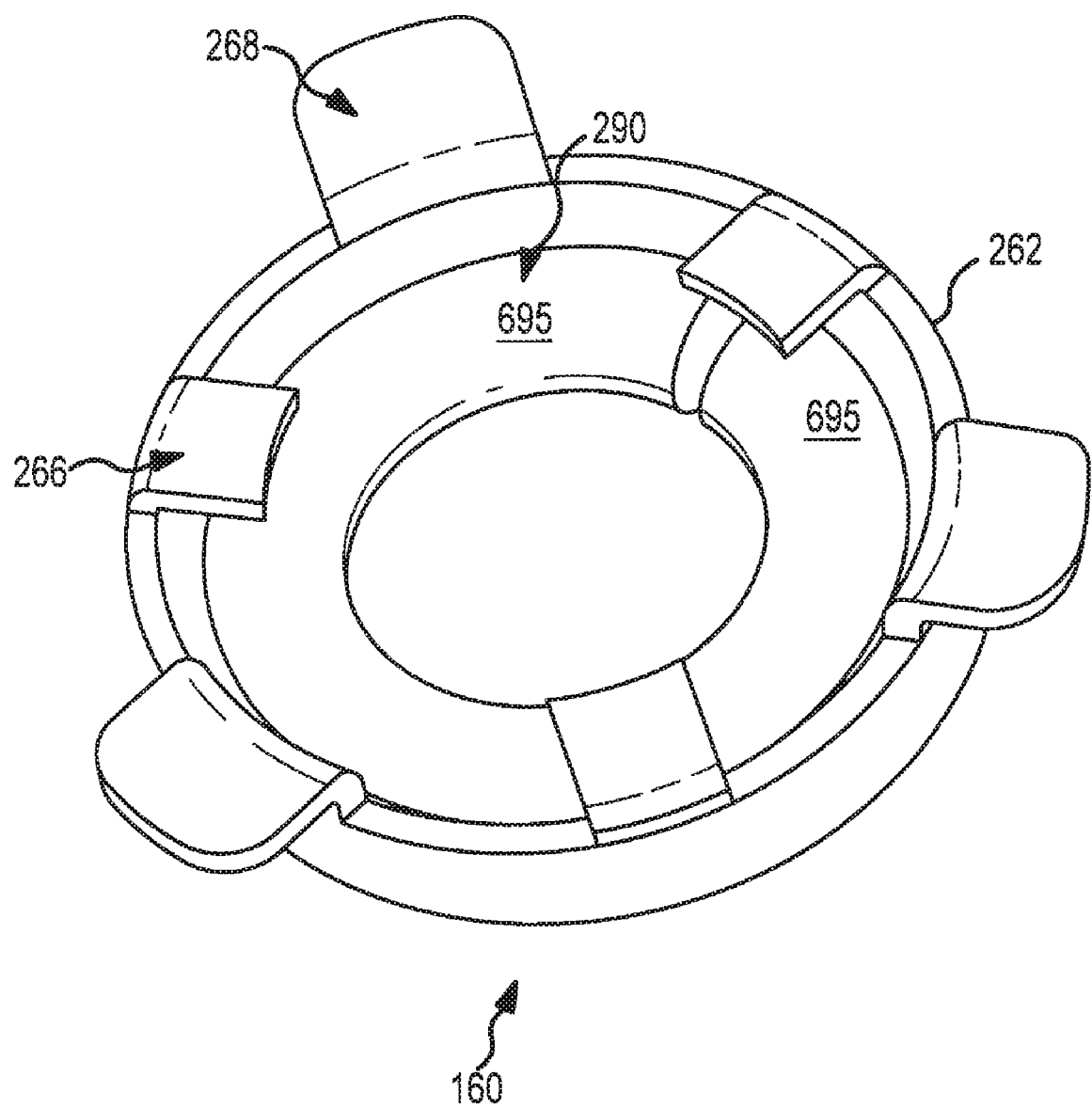
FIG. 7 is a perspective view of one of the retention assemblies prior to mounting upon a PCBA or other board showing the spring-force retention member retained within the retainer housing/spring holder (e.g., loosely held within sidewalls by one or more tabs that, in turn may abut a mating surface on the PCBA).

The retention assembly 160 is shown in more detail in FIG. 7. As shown, the retainer or spring holder 262 includes a set of inward directed or bent tabs 266 that act to hold the retention member or ring spring 290 in place prior to assembly or attachment to the board 130 and also act to position the spring 290 after placement on the board 130 (e.g., hold the ring spring 290 a distance of about the thickness of the tabs 266 above the surface 132 of board 130). Three tabs 266 are shown that are equidistally spaced about the circumference of the sidewall of the holder 262, but some embodiments (not shown) use fewer tabs while other use more tabs 266, with the specific number and location not being limiting of the invention (and some embodiments using a continuous or more continuous wall or tab). The spring holder 262 also includes a set of mounting legs 268 that extend outward from the sidewall of the holder 262. The legs 268 may also be equidistally spaced about the sidewall of holder 262 and number from 2, to 6, or more with three being shown as one useful example. The legs 268 are rigidly attached to the surface 132 of the board 130 such as by SMT, soldering, fasteners, or the like.

Also, as shown in FIG. 7, the inner diameter of the sidewalls of the holder 290 are typically chosen to be some amount larger than the outer diameters of the ring spring 290, as defined by the outer surfaces 292 of the ring spring 290. In this manner, the spring 290 is loosely fit and retained within the holder 262 such that it has adequate room to be expanded outward to allow the head 270 to pass through the center hole or passageway of the ring spring 290 (as defined by the inner surface 294). Typically, it will be useful to size the holder 262 such that the ring spring 290 can be fully expanded by the head 270 without being compressed (e.g., to limit the pressing force required to apply the board 130 to the standoff elements 150) but not so large that the ring spring 290 is not generally centered/aligned with the hole 236 for receiving the tip 274 of the standoff element 150. The holder 262 may be made of a single sheet of a metal suitable for soldering, SMT, and/or gluing with an adhesive or the like (or a plastic or other material may be used if fasteners are used to attach the legs 268 to the board 130). In many cases, the sidewalls of holder 262, the tabs 266, and legs 268 will all have the same thickness (but this is, of course, not required) to facilitate fabrication. The holder 262 (and sectional diameter of the spring 290) typically are chosen to provide a low profile on the board 130, and as such some embodiments call for a holder height of less than about 5, mm while others use a range of 2, to 3, mm to provide a desirable low profile on the surface 132 of PCBA or other board 130.

To further describe the mounting assembly 140, it may be useful with reference to FIGS. 1-7 to describe assembly of the computer 100 (or mounting of the board 130 to the chassis or enclosure wall or support surface 120. The mounting assembly 140 components are fabricated and assembled including a plurality of standoff elements 150 as shown in FIG. 3 and a like number of retention assemblies as shown in FIG. 7 (with the ring springs 290 being fabricated or purchased (e.g., a single loop of a ring spring or the like), the holder 262 being formed, and then the tabs 266 being bent inward to retain/position the inserted ring spring 290). Fabrication of the computer 100 continues with a wall 120 being modified, (e.g., counter-set holes drilled) to receive a set of the standoff elements 150 (e.g., 2, to 4, or more), and the standoff elements are attached or clinched to the chassis wall 120 as shown in FIG. 4. Then (or before or concurrently), a board 130 is modified to receive the standoff elements 150 such as by the drilling of four holes 236 at, for example, the corners of the board 130, and the retention assemblies 160 are attached to the surface 132 of the board 130 with the passageways through the holder 262 and ring spring 290 generally aligned with the holes 236. Again, this may involve use of SMT and soldering to attach the legs 268 of each holder 262 to the surface 132 of the board 130.

As discussed above, the heads 270 of the standoff elements 150 are shaped with a chamfer or slope from the tip 274 to the base/shoulder 272. In other words, the tip diameter, $d_{Tip}$, is less than the shoulder diameter, $d_{Shoulder}$, such that the retention member or ring spring 290 is forced to have its diameter, $d_{Ring}$, expanded from an at rest or first diameter to a larger diameter (e.g., about the size of the shoulder diameter, $d_{Shoulder}$) by the head contact surface 271 until the head 270 passes through the ring spring 290. At which point, the ring spring 290 attempts to return to its at rest diameter but instead applies a force to the neck 256 of the standoff element 150 (and/or to the shoulder 272 such as when the board 130 is vertically mounted). The neck diameter, $d_{Neck}$, is typically somewhat larger than the at rest ring diameter, $d_{Ring}$, (or second ring diameter) (such as up to 10, to 25, percent or more larger in diameter depending on the materials and configuration of the ring spring 290), to cause the ring spring 290 to apply a retention force as it attempts to return to its original or at rest size and shape.

With reference to FIGS. 1 and 2, the computer 100 is assembled (or the board 130 installed on the chassis wall 120) by aligning the holes 236 of the board 130 with the tips 274 of the standoff elements 150. Then, a pushing or pressing force is applied along the longitudinal axes of the standoff elements 150, and this pushing force causes the retention members or ring springs 290 in each of the retention assemblies 160 to expand (e.g., to have their diameter, $d_{Ring}$, increased to match the head diameters, $d_{Tip}$, to $d_{Shoulder}$). Once the ring springs 290 of the retention assemblies 160 clears the shoulder/bases 272 of the standoff heads 270, the ring springs 290 are restored toward their at rest shape and size where they apply a retention or holding force (a spring force) to the necks 256 of the standoff elements 150, which holds the board 130 in place relative to the chassis wall 120. In some embodiments, though, the neck diameter, $d_{Neck}$, may be less than the at rest ring diameter, $d_{Ring}$, such that no ongoing retaining force is applied, which may be useful in applications where the board 130 is horizontally mounted and some movement of the board 130 is acceptable relative to the standoff elements 150.

At this point, assembly or mounting is complete, and removal would simply involve applying a pulling force along the longitudinal axes of the standoff elements 150 (away from the wall 120) that is adequate in magnitude to overcome the spring forces of the ring springs 290 to cause them to expand to a ring diameter, $d_{Ring}$, of at least about the shoulder diameter, $d_{Shoulder}$, of the head 270 and release the board 130 from the standoff elements 150. The at rest diameter, $d_{Ring}$, of the ring spring 290 along with its material and cross sectional size may be adjusted (or selected) to obtain a suitable retaining force while not being so large that the board 130 would have to be overly flexed during mounting and removal/release as the boards 130 are typically relatively fragile or brittle (formed of a hard plastic or the like) and/or may have printed circuits and/or components harmed by flexing during installation. Also, the standoff neck height, $h_{Neck}$, may be selected to accommodate or based on the PCB thicknesses (e.g., to be about equal to the board thickness added to the profile height of the retention assembly 160).

The above described invention including the preferred embodiment and the best mode of the invention known to the inventor at the time of filing is given by illustrative examples only. It will be readily appreciated that many deviations may be made from the specific embodiments disclosed in the specification without departing from the spirit and scope of the invention. The mounting assembly and techniques described herein provide a number of benefits over prior board mounting techniques. The mounting assembly is user-friendly and simple to use as PCBAs may simply be pressed into place within the chassis. The mounting assembly also supports tool-less mounting and removal of a PCBA or other board (such as expansion boards). There is no loose or additional hardware or fasteners required for mounting, and this and other features provide improved assembly and serviceability. The mounting assembly (and a board mounted with the assembly) presents a compact form factor that enables placement of a board and mounting assembly in areas limited by tight space constraints (e.g., spaces where a board could not be positioned previously may now be used for one or more computer or electronics boards). The components, fabrication, and assembly of the mounting assemblies have a low cost, which allows them to be implemented in nearly all computer devices.

We claim:

1. A mounting assembly for retention and extraction of a printed circuit board to a support surface, the printed circuit board having at least two holes for facilitating mounting, comprising: a plurality of standoff elements extending from a support surface toward an interior space of a computer enclosure, each of the standoff elements comprising an elongated body, a neck extending from the body with a smaller diameter than the body, and a head extending from the neck; and a plurality of retention assemblies mounted to a surface of the printed circuit board, each of the retention assemblies comprising a spring-force retention member with a passageway with an at rest diameter smaller than at least a portion of the head, wherein the spring-force retention member is expandable to allow the head to pass through the passageway during mounting of the printed circuit board onto the plurality of standoff elements; wherein the spring-force retention member comprises a single coil of a ring spring with an inner diameter smaller than about a diameter of the head of the standoff element as measured proximate to the neck; wherein the head of each of the standoff elements comprises a shoulder adjacent to the neck and a tip distal to the shoulder, the shoulder having a diameter greater than a diameter of the tip to define an outward sloping contact surface on the head; and wherein the neck of each of the standoff elements has a height greater than about a combined thickness of the printed circuit board and the spring-force retention member and the neck of each of the standoff elements has a circular cross section when viewed along a longitudinal axis of the standoff elements having a diameter greater than about the at rest diameter of the passageway through the spring-force retention member.

2. The assembly of claim 1, wherein the spring-force retention member further comprises a gap between a first and second end, whereby the ring spring expands when the head of the standoff element is forced through the passageway of the spring-force retention member.

3. The assembly of claim 1, wherein each of the retention assemblies comprises a retainer retaining the spring-force retention member adjacent one of the holes on the printed circuit board, the retainer being attached to the surface of the printed circuit board and the retainer having a sidewall spaced apart from an outer surface of the spring-force retention member to allow a predetermined quantity of expansion of the spring-force retention member.

4. The assembly of claim 1, wherein the support surface comprises a surface of a computer chassis and wherein the printed circuit board includes four of the mounting holes and wherein the plurality of standoff elements comprises four of the standoff elements that are affixed to the surface of the computer chassis with a longitudinal axis extending through the body, neck, and head of each of the standoff elements and with the longitudinal axes being substantially parallel.

5. A tool-less mounting mechanism for use with a board used in a computing device, the mechanism comprising: a plurality of retention assemblies each comprising a spring holder attached to a surface of a board and including a passageway aligned with a hole in the board, wherein each of the retention assemblies includes a ring-shaped retention member with a first diameter; and a plurality of standoff elements extending outward from a surface of the computing device, each of the standoff elements comprising an elongated body, a neck extending from the body with a smaller diameter than the body, and a head extending from the neck; wherein the head of each of the standoff elements comprises a shoulder adjacent to the neck and a tip distal to the shoulder, the shoulder having a diameter greater than a diameter of the tip to define an outward sloping contact surface on the head; wherein the tip and shoulder diameters of the head of each of the standoff elements is less than about a diameter of the hole with the shoulder diameter being greater than the first diameter, whereby the board is retained on the plurality of standoff elements by the ring-shaped retention members that each expand to a second diameter equal to about the shoulder diameter to allow the heads to each pass through the passageway of the corresponding one of the retention assemblies and spring back toward the first diameter to apply a retention force; and wherein the neck of each of the standoff elements has a height greater than about a combined thickness of the board and the ring-shaped retention member and the neck of each of the standoff elements has a circular cross section when viewed along a longitudinal axis of the standoff elements having a diameter greater than about the first diameter of the ring-shaped retention member.

6. The mechanism of claim 5, wherein the body of each of the standoff elements has an outer dimension greater than the diameter of the hole in the board to provide a shelf for receiving a surface of the board proximate to the hole.

7. The mechanism of claim 6, wherein the neck of each of the standoff elements has a circular cross section with a diameter less than about the diameter of the hole and greater than about the first diameter of the ring-shaped retention member, whereby the retention force applied by the retention member is applied to the neck.

8. The mechanism of claim 7, wherein each of the retention members comprises a single coil of a ring spring and the coil includes a gap between its ends, whereby the coil is expandable to the second diameter.

9. The mechanism of claim 8, wherein the spring holder comprises a sidewall extending about an outer surface of the coil and wherein the sidewall is spaced apart from the outer surface when the retention member has the first diameter.

10. The mechanism of claim 5, wherein the board is rectangular in shape and includes four of the holes positioned proximate to each corner of the board and wherein the plurality of retention assemblies comprises four of the retention assemblies and the plurality of standoff elements comprises four of the standoff elements, the standoff elements extending outward from the wall with parallel longitudinal axes and being arranged in a pattern matching a pattern of the four holes on the board.

11. A computer device with a board mounted for tool-less installation and removal, comprising: a computer chassis with a mounting surface; a plurality of standoffs extending from the mounting surface toward an interior space of the computer chassis, each of the standoffs comprising an elongated body, a neck extending from the body with a smaller diameter than the body, and a head extending from the neck; wherein the head of each of the standoffs comprises a shoulder adjacent to the neck and a tip distal to the shoulder, the shoulder having a diameter greater than a diameter of the tip to define an outward sloping contact surface on the head; a printed circuit board comprising a plurality of mounting holes; a plurality of retainers each attached to a surface of the printed circuit board adjacent one of the mounting holes; and within each of the retainers, a retention member with an expandable passageway extending therethrough, wherein the printed circuit board is attached to the standoffs by pressing the sloping contact surface of each of the standoffs through one of the expandable passageways causing the expandable passageway to expand from a first diameter to a second diameter and to spring back toward the first diameter and abut the neck; wherein the retention members each comprises a ring spring defining a loop with an at rest inner diameter equal to the first diameter; and wherein the neck of each of the standoffs has a height greater than about a combined thickness of the printed circuit board and the retention member and the neck of each of the standoffs has a circular cross section when viewed along a longitudinal axis of the standoffs having a diameter greater than about the first diameter of the retention member.

12. The computer device of claim 11, wherein each of the retainers comprises a sidewall retaining one of the ring springs proximate to the surface of the printed circuit board and having an inner diameter greater than an external diameter of the retained one of the ring springs.

13. The computer device of claim 12, wherein the height of each of the sidewalls as measured from the surface of the printed circuit board is less than about 5, millimeters and wherein the first diameter of each of the retention members is less than about 3, millimeters.

14. The computer device of claim 11, wherein each of the retention members comprises a single coil of the ring spring with a gap between ends of the coil.

15. The computer device of claim 11, wherein the elongated body of each of the standoffs having an outer dimension greater than a diameter of a paired one of the mounting holes, and the outer dimension being greater than an outer dimension of the neck positioned adjacent the elongated body.

* * * * *

UNITED STATES PATENT AND TRADEMARK OFFICE
CERTIFICATE OF CORRECTION

| | | |
|---|---|---|
| PATENT NO. | : 7,983,057 B2 | Page 1 of 1 |
| APPLICATION NO. | : 12/417908 | |
| DATED | : July 19, 2011 | |
| INVENTOR(S) | : An-Sheng Anson Zheng et al. | |

It is certified that error appears in the above-identified patent and that said Letters Patent is hereby corrected as shown below:

Col. 12, line 40, please delete the "," after 5.
Col. 12, line 42, please delete the "," after 3.

Signed and Sealed this
Thirtieth Day of August, 2011

David J. Kappos
*Director of the United States Patent and Trademark Office*